(12) United States Patent
Sarihan et al.

(10) Patent No.: US 6,309,908 B1
(45) Date of Patent: Oct. 30, 2001

(54) PACKAGE FOR AN ELECTRONIC COMPONENT AND A METHOD OF MAKING IT

(75) Inventors: Vijay Sarihan, Paradise Valley; Lei L. Mercado, Gilbert, both of AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/469,942

(22) Filed: Dec. 21, 1999

(51) Int. Cl.[7] ............................. H01L 21/44; H01L 21/48; H01L 21/50
(52) U.S. Cl. ............................................. 438/106; 438/127
(58) Field of Search ....................... 438/106, 127

(56) References Cited

U.S. PATENT DOCUMENTS

| | | | |
|---|---|---|---|
| 5,817,545 | 10/1998 | Wang et al. | 438/127 |
| 5,866,949 | 2/1999 | Schueller | 257/778 |
| 5,868,887 | 2/1999 | Sylvester et al. | 156/150 |
| 5,900,312 | 5/1999 | Sylvester | 428/322.7 |
| 5,909,057 | 6/1999 | McCormick et al. | 257/704 |
| 5,953,814 | 9/1999 | Sozansky et al. | 29/840 |
| 5,959,348 | 9/1999 | Chang et al. | 257/700 |
| 5,981,312 | * 11/1999 | Farquhar et al. | . |
| 6,015,722 | * 1/2000 | Banks et al. | . |
| 6,083,774 | * 7/2000 | Shiobara et al. | . |
| 6,124,643 | * 9/2000 | Brand | . |
| 6,163,463 | * 12/2000 | Marrs | . |
| 6,187,613 | * 2/2001 | Wu et al. | . |
| 6,191,952 | * 2/2001 | Jimarez et al. | . |
| 6,207,475 | * 3/2001 | Lin et al. | . |
| 6,232,152 | * 5/2001 | DiStefano et al. | . |

* cited by examiner

Primary Examiner—John F. Niebling
Assistant Examiner—Josetta I. Jones
(74) Attorney, Agent, or Firm—A. Kate Huffman

(57) ABSTRACT

An electrical 100 and a method of making the package is disclosed. Specifically the package 100 contains a lid 101 with at least one opening 105 through the lid 101 into a cavity 180 surrounding the die 120 between the lid 101 and the substrate 130 of the package 100. Underfill material 150 is injected through the opening 105 to at least partially fill the cavity 180 to prevent both vertical and horizontal die cracking and to provide a more reliable package.

10 Claims, 2 Drawing Sheets

-PRIOR ART-

PACKAGE FOR AN ELECTRONIC COMPONENT AND A METHOD OF MAKING IT

FIELD OF THE INVENTION

This invention relates to a method of making and a package for an electronic component, particularly an integrated circuit, which effectively eliminates die cracking in the package and improves reliability of the package.

BACKGROUND OF TH INVENTION

The demand for electronic component packages, especially packages for flip-chip integrated circuits, that are both reduced in size and more reliable has increased dramatically. Additionally, the demand for certain semiconductor devices, of increasing size has also grown. These factors, coupled with the inherent issues of combining device substrate and package materials having different Coefficients of Thermal Expansion (CTE), result in failure of the packages. Most package failures are due to failure of the joints of the package, particularly solder joints, and cracking in the semiconductor devices or dies.

The major types of die cracking are vertical cracking initiated from the die backside and horizontal cracking initiated from the die edge. Vertical cracks begin on the backside of the die and travel downward from the top of the chip to the substrate and are frequently caused by backside defects of the die. Horizontal cracks are those cracks that occur along the edges of the die and are most frequently due to die singulation.

One means for eliminating die stress in an electronic assembly is described in Sylvester et al. (U.S. Pat. No. 5,868,887). In the prior art method one surface of a die is connected to a package and an opposite die surface is disposed over a constraining ring that is mounted to the package. The lid has a size, shape and CTE selected to generate a bending moment that opposes bending moments resulting from connecting the die to the package.

The requirement of a stiffener ring in the patented method results in a package that is more costly and is less robust. Additionally, the selection of materials that have matching CTE values limits the flexibility of the package design and ease of manufacturing.

McCormick et al. (U.S. Pat. No. 5,909,057) describes a semiconductor package that includes a heat spreader/stiffener that is equipped with a plurality of apertures to provide access for underfill to flow in the space between the die and the substrate. A conventional adhesive is used to attach the stiffener component to the die. The resulting package is, however, rigid and prone to die cracking. Further, moisture may be trapped in the package during the patented manufacturing process that damages the electronic components.

A method and device to encapsulate integrated circuits is claimed in wang et al: (U.S. Pat. No. 5,817,545). A special mold surrounds the chip to be encapsulated in a cavity and the encapsulant is injected into the cavity at an elevated pressure and/or temperature. Additional equipment and process steps are required to perform the high pressure and temperature encapsulation.

Accordingly, a need exists for an improved package for an electronic component that effectively eliminates both horizontal and vertical cracking in the semiconductor device of the package to provide a more reliable package that is easier to manufacture.

A further need exists to improve the reliability of the joint connections, particularly solder joints to provide a more robust semiconductor package.

BRIEF DESCRIPTION OF THE DRAWINGS

The present invention will be better understood from a reading of the following detailed description, taken in conjunction with the accompanying drawing figures in which.

Figure 1:
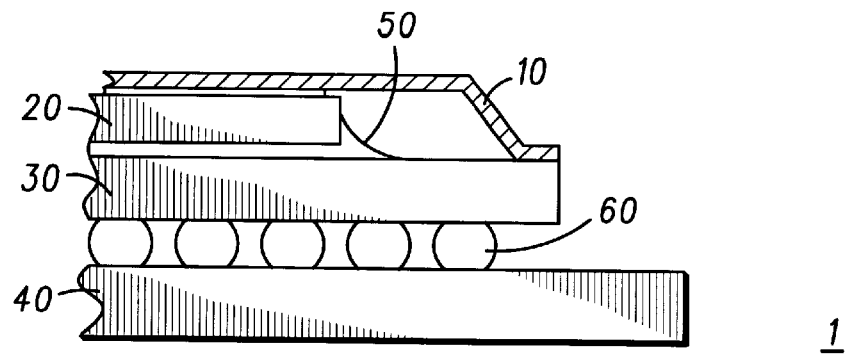
FIG. 1 is a schematic cross sectional view of a prior art package illustrating the position of the underfill material.

For simplicity and clarity of illustration, the drawing figures illustrate the general manner of construction, and elements in the drawing figures are not necessarily drawn to scale. Additionally, the same reference numerals in different figures denote the same elements, and descriptions and details of well-known features and techniques are omitted to avoid unnecessarily obscuring the present invention. Furthermore, the terms left, right, front, back, top, bottom, over, under, and the like in the description and in the claims, if any, are used for descriptive purposes. However, it is understood that the embodiment of the invention described herein is operational in other orientations than described or illustrated herein. It is further understood that the terms so used are for the purposes of describing relative positions and are interchangeable under appropriate circumstances.

DETAILED DESCRIPTION OF PREFERRED EMBODIMENT

A prior art electronic component package 1 is illustrated in FIG. 1. In particular, a heat dissipation lid 10 is attached to a die 20 that is, in turn, attached to a semiconductor substrate 30 by any means in the art. A discrete, such as a printed circuit board, may be attached to one side of the semiconductor substrate 30 as is known in the art.

An underfill material 50 is inserted into a space between the die 20 and the substrate 30 to help mechanically interlock the die 20 to the substrate 30. The underfill material is typically a dielectric organic material and functions, in part, to lessen the impact of the CTE (coefficients of thermal expansion) mismatch between the die 20 and the substrate 30 to reduce failure of the solder interconnections when variations in temperature occur.

Conventionally, the underfill material 50 does not wet to the top of the die 20 so that the die edge is only partially covered. Subsequently, defects along the die edge due to die singulation result in die edge horizontal cracking. Moreover, the material used to attach the lid 10 to the die 20 needs to exhibit a low modulus (e.g. to avoid local stress concentration). However, a low modulus material has negligible impact on die bending that results in backside vertical cracking.

The die 20 may be attached to the substrate 30 by any conventional means known in the art. Preferably, the die 20 is soldered to the substrate 30 by means of solder bumps or a ball grid array. The substrate 30 is attached to the substrate 40, such as a printed circuit board, by any means known in the art but preferably also by solder bumps 60 or a ball grid array. Underfill material 50 is often used in the space between the die 20 and the substrate 30 in the prior art package 1 with a lid 10. It was observed that the packages have about the same solder fatigue life as a prior art package without a lid.

Figure 2:
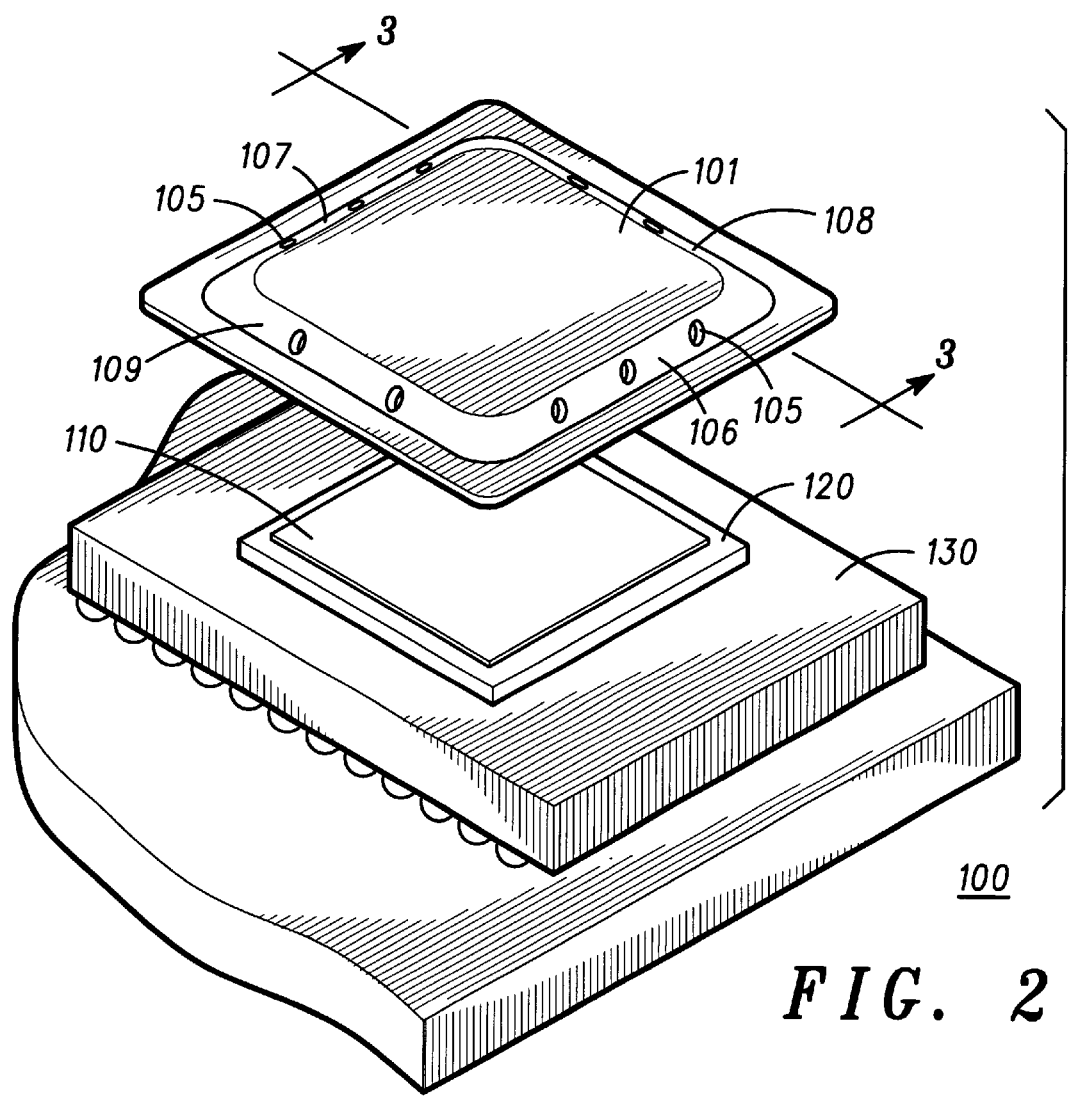
FIG. 2 is a schematic exploded view of a flip-chip package illustrating the package according to the invention.

FIG. 2 illustrates a preferred embodiment of the inventive package. The package 100 is illustrated as containing a lid 101 attached to a semiconductor device or die 120. The lid is preferably thermally coupled to the die and not mechanically coupled and the coefficients of thermal expansion of the lid 101 and the die 120 do not necessarily have to be matched. Therefore, a variety of metal materials may be selected for the lid such as aluminum, stainless steel, copper and brass. Other materials such as ceramics may also be used.

In a preferred embodiment, the lid 101 is attached to the semiconductor device 120 by means of a material 110 that exhibits a modulus value of between about 0.003 GPa and about 12 GPa, preferably less than about 7 GPa, most preferably less than about 1 GPa. Examples of such attaching materials 110 are epoxy materials such as Thermabond™ adhesive, a silicone-based thermal grease supplied under the trademark Thermalcote ™ I, and a silicone-free thermal grease supplied by the trademark Thermalcote™ II, all supplied by Thermalloy Inc. of Dallas, Tex. Other suitable attaching materials may be obtained from AAVID Inc. of New Hampshire and Chomerics, Inc. of New Hampshire.

The die 120, such as silicon or II-V materials such as gallium arsenide, is attached to any conventional semiconductor substrate known in the art. In a preferred embodiment, the die is attached to the substrate 130 by means of solder bumps that form a space 133 between the die 120 and the substrate 130. As solder bump density increases, the space 133 decreases.

Space 133 is filled with an underfill material 150 which is a dielectric organic material used to help mechanically interlock the die 120 to the substrate 130. Preferred underfill materials are silica filled epoxy resins such as Dexter Hysol FP series, Namics, Zymet, and Alpha Metals EL-18LS.

Figure 3:
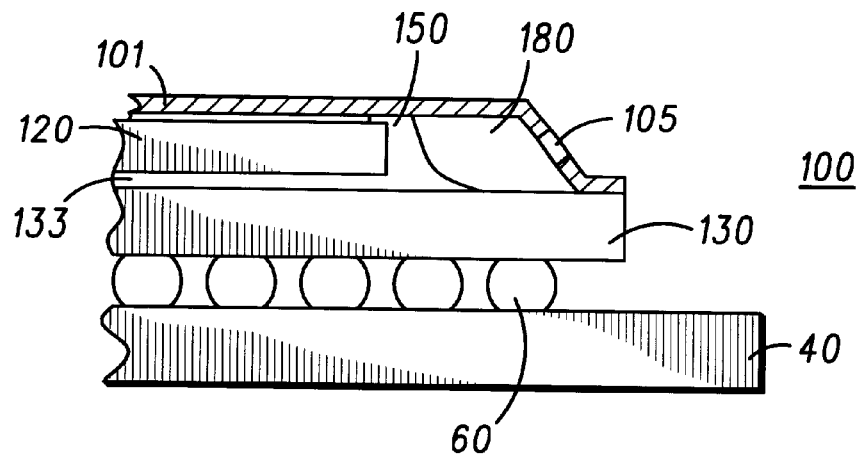
FIG. 3 is a schematic cross sectional of a package of the invention illustrating a preferred position of the underfill material.
Figure 4:
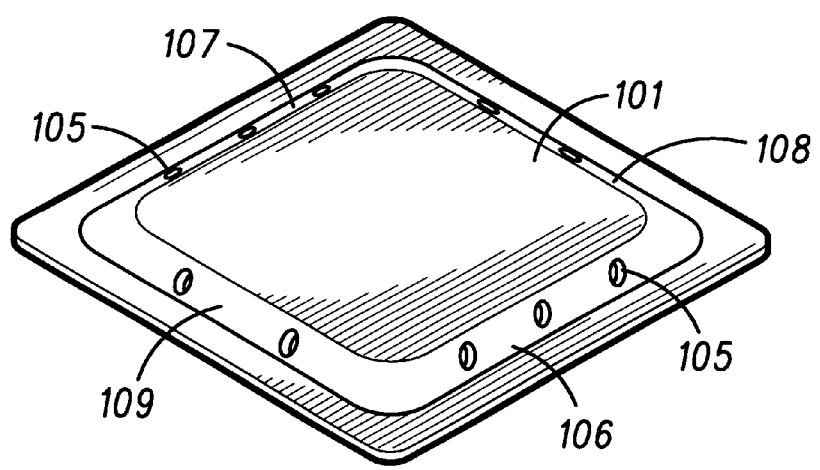
FIG. 4 is a top isometric view of a preferred embodiment of a lid of the invention.

As illustrated in FIG. 3, the underfill material 150 fills approximately one-half of a cavity 180 formed under the lid 101 and bounded by the substrate 130 and die 120. By so filling the cavity 180 about one-half, die edge cracking is eliminated and die backside cracking is reduced. Die backside bending stress is reduced from 100 MPA to 0 and solder fatigue life was observed to improve about 20% when the cavity 180 is filled only about 25%. When the underfill material 150 substantially filled the cavity 180, solder fatigue life was observed to improve about 35%.

The underfill material 150 is used to fill the cavity 180 under the lid 101 by several different methods. In one preferred method a hole 105 is punched in one side 106 of the lid 101 as illustrated. In another preferred embodiment, a plurality of holes 105 may be punched in the side 106 or also in another side, such as opposing side 107 or any other adjacent sides 108, 109.

As illustrated in FIG. 3, a package 100 is assembled but no underfill 150 is used in space 133. The lid 101 is connected to the die 120, preferably with thermal grease or silicone elastomer pad, and bonded to the substrate 130, preferably with epoxy. Underfill 150 is injected through the holes 105 until the cavity 180 is filled to at least about 25% of the cavity 180.

In another preferred method, the package 100 is assembled and underfill 150 is provided between the die 120 and the substrate 130 in space 133. The lid 101 contains one hole punched on one side of the lid 101 and a second hold on an opposite side of the lid 101. The lid 101 is attached to the die 120 and bonded to the substrate 130. Underfill material 150 is injected through the hole on one side of the lid until the underfill material 150 exits from the cavity 180 through the hole on the opposite side of the lid. Preferably, there are no voids in the cavity 180 and the space 133 prior to curing the package as is conventionally known.

In a third method according to the invention, a package 100 is assembled but no underfill 150 is used in space 133. The lid 101 is attached as described wherein the underfill 150 is injected into a hole on one side of the lid 101 until it exits through a hole on the other side of the lid. The underfill material 150 fills space 133 by means of capillary action.

It has been observed that the C5 (Controlled Collapse Chip Carrier Connection) reliability of fully filled packages is improved by about 40%.

Finally, the lid 101 may contain one opening through which underfill is injected into the cavity 180 and air in the cavity 180 burps out of the cavity 180 through the same opening.

Therefore, an improved electronic component package is provided to overcome the disadvantages of the prior art. The package and method of making it described herein exhibit more reliability for larger semiconductor device sizes than those achieved in the prior art. Vertical and horizontal cracking along the die edges and backside were substantially eliminated to provide a more reliable package that is easier to manufacture and is more cost efficient.

While the present invention has been particularly shown and described mainly with reference to specific embodiments, it will be understood by those skilled in the art that various changes in form and detail may be made to the embodiments herein without departing from the spirit or scope of the present invention. For instance, the numerous details set forth herein such as the material compositions, are provided to facilitate the understanding of the present invention and are not provided to limit the scope of the present invention. Furthermore, while a flip-chip package is described in detail herein, one skilled in the art will recognize that the concept disclosed herein can be applied to other types of component packages.

Accordingly the disclosure of the present invention is not intended to be limiting. Instead the disclosure of the embodiments of the present invention is intended to be illustrative of the scope of the present invention. It is intended that the scope of the present invention shall be limited only to the extent required by the appended claims.

We claim:

1. A method for manufacturing a package for an electronic component comprising the steps of:

a. attaching an electronic component onto a substrate;

b. selecting a lid having a first portion with at least one opening extending through it;

c. mounting the lid onto the electronic component to define a cavity between the first portion of the lid and the substrate so that the at least one opening extends into the cavity and the cavity surrounds the edges of the electronic component; and d. inserting an underfill material through the at least one opening of the first portion of the lid and into the cavity to fill about one-fourth of the cavity and to surround the edges of the electronic component.

2. The method according to claim 1 wherein the step of inserting the underfill material further comprises filling the cavity to about one-half.

3. The method according to claim 1 wherein the lid further comprises a second portion on an opposite side from the first portion and the second portion comprises at least one opening that extends through the lid into the cavity.

4. The method according to claim 3 wherein the step of inserting the underfill material further comprises inserting the underfill material through the at least one opening of the first portion to fill about one-fourth of the cavity with the underfill material and to allow air within the cavity out of the cavity through the opening in the second portion of the lid.

5. The method according to claim 1 wherein the step of selecting the lid further comprises selecting a lid made of a metal or ceramic material.

6. The method according to claim 1 wherein the underfill material is a dielectric organic material.

7. The method according to claim 1 wherein the step of mounting the lid to the substrate further comprises applying a material having a modulus of about 0.1 GPa to about 12 GPa.

8. The method according to claim 1 wherein the package is a flip-chip package.

9. A method of manufacturing a flip-chip package comprising the steps of:
   a. attaching an integrated circuit onto a substrate;
   b. selecting a lid having a first portion with at least one opening extending through it;
   c. mounting the lid onto the integrated circuit to define a cavity between the first portion of the lid and the substrate so that the at least one opening extends into the cavity and the cavity surrounds the edges of the integrated circuit; and
   d. inserting an underfill material through the at least one opening of the first portion of the lid and into the cavity to fill about one-fourth of the cavity and to surround the edges of the integrated circuit.

10. The method according to claim 9 wherein the lid further comprises a second portion on an opposite side from the first portion and the second portion comprises at least one opening that extends through the lid into the cavity.

* * * * *